US011106136B2

(12) United States Patent
Mühlfeit et al.

(10) Patent No.: US 11,106,136 B2
(45) Date of Patent: Aug. 31, 2021

(54) LASER-ABLATABLE MASK FILM

(71) Applicant: Flint Group Germany GmbH, Stuttgart (DE)

(72) Inventors: Markus Mühlfeit, Weil der Stadt (DE); Alfred Leinenbach, Oberkirch-Nußbach (DE); Jochen Unglaube, Kenzingen (DE)

(73) Assignee: Flint Group Germany GmbH, Stuttgart (DE)

( * ) Notice: Subject to any disclaimer, the term of this patent is extended or adjusted under 35 U.S.C. 154(b) by 20 days.

(21) Appl. No.: 15/744,553

(22) PCT Filed: Jul. 14, 2016

(86) PCT No.: PCT/EP2016/066728
§ 371 (c)(1),
(2) Date: Jan. 12, 2018

(87) PCT Pub. No.: WO2017/009410
PCT Pub. Date: Jan. 19, 2017

(65) Prior Publication Data
US 2018/0203356 A1 Jul. 19, 2018

(30) Foreign Application Priority Data
Jul. 15, 2015 (EP) .................. 15176893

(51) Int. Cl.
*G03F 7/20* (2006.01)
*G03F 7/039* (2006.01)
*B41M 5/24* (2006.01)
*G03F 7/34* (2006.01)
*G03F 7/36* (2006.01)
*G03F 7/40* (2006.01)
*G03F 7/16* (2006.01)
*G03F 1/68* (2012.01)

(52) U.S. Cl.
CPC .............. *G03F 7/202* (2013.01); *B41M 5/24* (2013.01); *G03F 1/68* (2013.01); *G03F 7/039* (2013.01); *G03F 7/16* (2013.01); *G03F 7/343* (2013.01); *G03F 7/36* (2013.01); *G03F 7/40* (2013.01)

(58) Field of Classification Search
CPC ....................................................... G03F 7/36
See application file for complete search history.

(56) References Cited

U.S. PATENT DOCUMENTS

| | | | | |
|---|---|---|---|---|
| 3,010,919 A | * | 11/1961 | Mackinney | ............... C08F 8/00 525/58 |
| 5,998,088 A | | 12/1999 | Robello et al. | |
| 6,001,530 A | | 12/1999 | Kidnie et al. | |
| 6,828,067 B2 | | 12/2004 | Sweet et al. | |
| 8,632,944 B2 | | 1/2014 | Zwadlo et al. | |
| 8,945,813 B2 | | 2/2015 | Kidnie | |
| 2006/0008729 A1 | * | 1/2006 | Ichikawa | ................ G03F 7/202 430/270.1 |
| 2009/0081414 A1 | * | 3/2009 | Sugasaki | ................... B41C 1/05 428/172 |
| 2011/0251060 A1 | * | 10/2011 | Harrison | .................. B41M 5/41 503/207 |
| 2012/0015288 A1 | * | 1/2012 | Ikeda | ...................... G03F 7/202 430/5 |
| 2016/0229172 A1 | * | 8/2016 | Stebani | ................... G03F 7/092 |

FOREIGN PATENT DOCUMENTS

| | | | |
|---|---|---|---|
| EP | 0562952 B1 | 12/1996 | |
| EP | 2047987 A2 | 4/2009 | |
| EP | 2416217 A1 | 2/2012 | |
| WO | WO-9742547 A1 | 11/1997 | |
| WO | WO-2015040094 A2 | * 3/2015 | ........... G03F 7/3057 |

OTHER PUBLICATIONS

International Search Report for PCT/EP2016/066728 dated Sep. 9, 2016.
Written Opinion of the International Searching Authority for PCT/EP2016/066728 dated Sep. 9, 2016.

* cited by examiner

*Primary Examiner* — Chanceity N Robinson
(74) *Attorney, Agent, or Firm* — Faegre Drinkger Biddle & Reath LLP

(57) ABSTRACT

The invention relates to a laser-ablatable mask film for the exposing of relief printing plates and screen printing stencils, comprising at least
(i) a dimensionally stable base sheet,
(ii) a UV-transparent adhesion layer, and
(iii) a laser-ablatable mask layer,
characterized in that the laser-ablatable mask layer (iii) comprises
a) a binder comprising a crosslinked polyvinyl alcohol,
b) a material which absorbs UV/VIS light and IR light, and
c) optionally an inorganic filler.

29 Claims, No Drawings

LASER-ABLATABLE MASK FILM

CROSS-REFERENCE TO RELATED APPLICATIONS

This application is a national stage application (under 35 U.S.C. § 371) of PCT/EP2016/066728, filed Jul. 14, 2016, which claims benefit of European Application No. 15176893.4, filed Jul. 15, 2015, both of which are incorporated herein by reference in their entirety.

The invention relates to a laser-ablatable mask film for the exposure of relief printing plates and screen printing stencils, and to its use.

Mask films are needed for lithographic processes, as for example for producing printing plates, screen printing formes, printed conductor tracks, semiconductors, and in a multiplicity of other graphics operations, e.g., as simple correction films. Whereas, formerly, photographic films were used, based on the imagewise reduction of silver salts, it is increasingly the case nowadays that digitally imagable mask films—that is, mask films which can be imaged using lasers—are being employed.

For example, for the exposure of photopolymeric relief printing plates, such as flexographic or letterpress or gravure plates, or screen printing stencils, mask films are used. The mask film is imaged by means of a laser. In the imaging process, the regions to be exposed are removed by laser ablation. The imaged mask film is subsequently placed onto a photopolymeric printing plate and is brought by vacuum into intimate contact with the printing plate to be exposed. Alternatively, the mask film can also be laminated onto the printing plate by application of pressure or elevated temperature. The photopolymeric printing plate is subsequently imaged areally with UVA light through the mask film. On exposure, the exposed regions of the printing plate cure and, in so doing, become insoluble in solvents. The unexposed regions remain soluble and are removed in a subsequent washout or developing step. This produces the desired print relief.

It will be immediately apparent that the mask film ought to possess a high resolution and ought to have a high optical density in the UVA light range. For crosslinking relief printing plates, the optical density of the mask film in the range from 350 to 400 nm ought to amount to at least 2.5-3. The ablated regions of the mask film, conversely, ought as far as possible to be transparent for UVA light. The optical density ($OD_{min}$) here ought to be less than 0.1. Furthermore, the mask film ought to develop effective contact with the surface of the relief printing plate, in order to prevent copying errors, and ought to be able to be removed again following the areal UVA exposure without substantial expenditure of force. On exposure, no constituents ought to migrate from the mask film into the relief-forming layer. For reasons of cost, the mask film should be easily producible and should be reusable.

A mask film possesses at least one laser-ablatable layer and a base material which is transparent for UV light. Transparent polyester films, for example, can be used as base material.

The ablation of the mask film may be performed by means of various lasers. Lasers which emit light in the near IR wavelength range are used preferentially. They include, for example, IR laser diodes (830 nm) or Nd-YAG solid-state lasers or fiber lasers (1064 or 1100 nm, respectively).

A condition for the effective imaging of a mask film by ablation is the absorption of the laser beam. Finely divided carbon black, for example, is a very effective absorber in the near IR range. Alternatively to carbon black, IR-absorbing dyes can also be used in the mask films.

U.S. Pat. No. 5,998,088 describes, for example, a laser-ablatable mask material which consists of polycyanoacrylate as polymeric binder and of IR-absorbing dyes. The thermally labile polycyanoacrylate gives the mask film high laser sensitivity.

U.S. Pat. No. 6,001,530 describes laser-ablatable mask materials which are used as coloring components in thermal transfer printing. The laser-ablatable layer consists of a combination of carbon black and soluble, black dyes.

U.S. Pat. No. 6,828,067 describes laser-ablatable mask films which as well as carbon black additionally contain UV-absorbing dyes. A relatively low layer thickness can be realized accordingly, and the films exhibit high resolution and sensitivity.

EP 0562952 B1 describes laser-ablatable mask materials comprising a polymer which contains azide groups, and IR-absorbing dyes. The masks again have good laser sensitivity.

U.S. Pat. No. 8,632,944 describes a multilayer mask film which comprises different IR- and UV-absorbing substances. Nitrocellulose and polycyanoacrylates are used as polymeric binders of the individual layers, and give the mask film high laser sensitivity. As a result of the multilayer construction, the mask film is expensive to produce.

A simpler construction is described by U.S. Pat. No. 8,945,813. In this case the mask contains only a few individual layers. The laser sensitivity here, however, is also achieved by means of IR-absorbing dyes. Furthermore, low molecular mass UV absorbers are used.

All of the stated mask films include low molecular mass components such as, for example, soluble IR dyes or UV absorbers, which on exposure with UVA light may migrate into the relief printing plate to be exposed. If this migration takes place, the property profiles both of the mask film and of the printing plate are altered. After the mask has been contacted with the printing plate, therefore, exposure must be carried out without delay in order to minimize these migration effects. The re-use of the mask film—i.e., multiple exposure through the same mask—is therefore not an option.

Furthermore, the stated mask films include expensive ingredients such as IR absorbers, UV absorbers or specialty binders such as nitrocellulose, polymers containing azide groups, or polycyanoacrylates, or the mask films have a multilayer construction, which further raises the production costs.

There is therefore a commercial interest in a laser-ablatable mask film which has good laser sensitivity, can be produced inexpensively, and can be used for reliable processing of photopolymeric printing plates (flexographic, letterpress or gravure plates and screen printing formes); in particular, multiple exposure with a single mask ought to be readily possible. Given that the majority of processors of relief printing plates nowadays no longer possess units for the production of photographic silver films, there is a requirement, furthermore, for a simple, inexpensive, laser-ablatable mask film which can be issued and checked as correction film before actual printing-plate processing is commenced. Accordingly, before an expensive digital flexo plate is imaged (lasered), a less costly mask film is lasered, and then checking takes place to see whether all of the elements have been correctly placed and reproduced.

The object is achieved by means of a laser-ablatable mask film for the exposure of relief printing plates and screen printing stencils, comprising at least (i) a dimensionally stable base sheet,
(ii) a UV-transparent adhesion layer, and
(iii) a laser-ablatable mask layer,
characterized in that the laser-ablatable mask layer (iii) comprises
a) a binder comprising a crosslinked polyvinyl alcohol,
b) a material which absorbs UV/VIS light and IR light, and
c) optionally an inorganic filler.

Preferred as dimensionally stable base (i) are polyester films, more particularly polyethylene terephthalate (PET) films. Highly suitable PET films are those with a thickness of 50 μm to 200 μm. Particularly preferred are PET films 125 μm or 175 μm thick. The films ought to have a moderate roughness. PET films having an average peak-to-valley height of between 0.1 μm and 1 μm are preferred.

The UV-transparent adhesion layer (ii) —also referred to as primer layer—has two key functions. It produces the adhesion to the dimensionally stable base (i), and it protects the base from the high temperatures which occur in the course of laser ablation, and which can lead to the incorporation of particles of carbon black, or other combustion products, into the base sheet, thereby possibly reducing the UV-transparency of the image regions of the laser-ablated mask film.

The adhesion layer (ii) is transparent for UVA light, i.e., for light in the wavelength range of 300-400 nm. The transmittance for UVA light ought to be at least 50%, preferably at least 80%.

The adhesion layer (ii) comprises essentially a polymeric binder, which may optionally be crosslinked, and further optionally comprises one or more fillers.

Highly suitable as polymeric binders d), for example, are polyesters, polyetheresters, polyurethanes, and polyesterurethanes, which are able to develop high adhesion to polyester sheets. The polymeric binder may be applied either as a 1-component system or as a crosslinking 2-component system with suitable polyfunctional crosslinkers. Particularly suitable binders are polymers, generally polyesters or polyesterurethanes having OH groups, of the kind available commercially under the trade names Desmocoll® and Desmophen® (Bayer), for example. Especially suitable as crosslinkers e) for these are aliphatic polyfunctional isocyanates or aromatic polyfunctional isocyanates, or mixtures of aliphatic and aromatic polyfunctional isocyanates, of the kind available under the trade name Desmodur® (Bayer), for example.

Where a crosslinking 2-component system is used, the proportion of the crosslinker is 5 to 30 wt %, based on all components of the adhesion layer (ii); preferably this proportion is 10 to 20 wt %.

In order to improve the freedom from tack, the adhesion layer (ii) may optionally comprise a mineral filler. Highly suitable examples are silicon dioxide, especially finely ground quartzes and powdered quartzes, silicates, especially aluminum silicates, silicate glasses, or aluminum oxides. The proportion of the filler in the adhesion layer (ii) may be 0 to 30 wt %, preferably 0 to 15 wt %, based on all components of the adhesion layer (ii). In the image regions of the laser-ablated mask layer, the filler functions as a kind of spacer, thereby producing effective contact between these regions and the printing plate on UV exposure, and reducing the danger of undercutting. The film must conform closely to the flexo plate to be exposed, without sticking. If it adheres too strongly to the printing plate, air inclusions are formed at some locations between film and printing plate. On exposure, the UV light will be scattered by the air, resulting in copying defects or undercutting.

The adhesion layer (ii) generally comprises
d) 70 to 100 wt % of the polymeric binder,
e) 0 to 30 wt % of the crosslinker,
f) 0 to 30 wt % of the inorganic filler.

The thickness of the adhesion layer (ii) is generally 0.1 μm to 2 μm, preferably 0.7 μm to 1.5 μm. If the adhesion layer is too thin, the protection from exposure to the laser radiation may be inadequate. If the adhesion layer is too thick, the resolution of the mask layer may be adversely effected by UV light scattering effects.

The key element of the present invention is the composition of the laser-ablatable mask layer (iii), which essentially comprises a crosslinked binder based on polyvinyl alcohol, and a carbon-based, migration-stable absorber for UV/VIS light and IR laser light, and optionally a mineral filler.

Surprisingly it has been found that with polyvinyl alcohols as binders, in combination with a carbon-based UV/VIS and IR absorber, it is possible to formulate very sensitive, laser-ablatable layers. If these layers are additionally crosslinked during production, they result in high-resolution mask films which can be handled easily and reliably and which are suitable for a multiplicity of photolithographic processes. As a result of both the adhesion layer and the laser-ablatable layer containing few if any constituents of low molecular mass, the exposure with UVA light is not accompanied by any substantial migration of constituents of the mask layer into the printing plate that is to be exposed, and the mask film can easily be used a number of times.

Polyvinyl alcohols are polymers having vinyl alcohol units, especially polyvinyl acetates which are partially or completely hydrolyzed. Vinyl acetate-vinyl alcohol copolymers are characterized according to the molecular weight and the degree of hydrolysis (the percentage fraction of vinyl alcohol units in the polymer, based on the total number of monomer units). The crystallinity of the products and their mechanical properties can be controlled in accordance with the degree of hydrolysis. The polar nature of the OH groups, furthermore, is responsible for the effective dispersing power of the polyvinyl alcohols. Polyvinyl alcohols are highly suitable from the standpoint of laser ablation as well. They do not exhibit pronounced melting, but instead decompose without residue when exposed to high temperatures— of the kind occurring during laser ablation.

For the laser-ablatable mask layer of the invention, polyvinyl alcohols having a medium to high degree of hydrolysis are preferred. If the degree of hydrolysis is too low, the polymers are too soft and too sensitive. On complete hydrolysis, the polymers are hard and brittle. The surface of the mask film may then even rupture. Generally speaking, polyvinyl alcohols used have a degree of hydrolysis of 50% up to a maximum of 99%. Preference is given to using polyvinyl alcohols having a degree of hydrolysis of 60% to 90%.

It is also possible to use other vinyl alcohol copolymers, such as poly(vinyl propionate-vinyl alcohol), poly(vinyl acetal-vinyl alcohol), and poly(ethylene-vinyl alcohol), for example, as binders of the laser-ablatable layer, provided they contain at least 50 mol % of vinyl alcohol units.

Especially suitable as IR absorbers for the laser-ablatable mask layer are finely-divided carbon black, graphite, carbon-black nanotubes or carbon-black nanoparticles. Carbon black has a broad absorption spectrum, which extends from the visible region into the IR region. Layers containing carbon black can therefore be ablated with either IR laser diodes (830 nm) or Nd-YAG solid-state lasers or fiber lasers (1064 nm). Of course, the laser-ablatable layer may also comprise other migration-stable, pigment-based IR absorbers, however. On account of their capacity for migration, though, soluble IR dyes of low molecular mass or other dyes of low molecular mass, such as UV absorbers, for example, are as far as possible not used in the laser-ablatable layer.

The carbon black particles may have been surface-treated. For example, the charge density on the particle surface may be modified by suitable dispersants, allowing the production of particularly finely divided carbon black dispersions. Low molecular mass carbon black dispersing assistants as well can migrate into the printing plate and alter the profile of properties of the laser-ablatable mask film. When using such assistants, therefore, it is necessary to ensure that the affinity of the dispersing assistants for the surface of the carbon black particles is much higher than for the binders used.

The amount of the IR absorbers is generally 5 to 70 wt %, preferably 30 to 60 wt %, based on the amount of all the components of the laser-ablatable mask layer (iii).

The polyvinyl alcohol of the laser-ablatable mask layer (iii) is additionally crosslinked chemically during the production of the mask layer (iii). Without crosslinking, polyvinyl alcohol/carbon black layers do already have excellent laser sensitivity, but at the same time are sensitive to moisture. The resistance of the laser-ablatable mask layer to high atmospheric humidity is considerably improved if the polyvinyl alcohols are crosslinked chemically. Without crosslinking, polyvinyl alcohol layers require cautious handling. In order to avoid fingerprints on the laser-ablatable mask layer, it is advisable to wear gloves. Crosslinked polyvinyl alcohol layers, conversely, are insensitive toward moisture and fingerprints, and so no special measures are needed during the handling of the mask film.

A variety of crosslinkers are contemplated for the chemical crosslinking of the recording layer based on polyvinyl alcohols, such as polyfunctional isocyanates, mono- or polyfunctional aldehydes, polyfunctional epoxides, polyfunctional carboxylic acids, and polyfunctional carboxylic anhydrides.

Particularly preferred among the crosslinking reactions is the reaction of polyvinyl alcohols with polyfunctional isocyanates, polyfunctional epoxides, or mono- or polyfunctional aldehydes. These crosslinking reactions proceed almost quantitatively at temperatures that are not too high. Preferred crosslinkers are aldehydes such as formaldehyde, acetaldehyde, propionaldehyde, butyraldehyde, and higher aldehydes. As well as their high reactivity, these crosslinkers have the further advantage that they consist only of carbon, oxygen, and hydrogen. In conjunction with polyvinyl alcohols, the resulting mask layers have toxic gas emissions on laser ablation that are considerably less than those of mask layers which comprise nitrogen-containing components, such as isocyanates, for example.

Particularly preferred is crosslinking with difunctional aldehydes such as glyoxal and glutaraldehyde, for example. These aldehydes are already in the form of an aqueous solution and can therefore be admixed readily to aqueous or alcoholic polyvinyl alcohol solutions. The solutions are sufficiently stable at room temperature and can therefore readily be applied in layers. After coating has taken place, the layers are briefly heated to temperatures of 90° C. to 120° C. The OH groups of the polyvinyl alcohol react at these temperatures with the aldehyde functions to form acetals. Where difunctional aldehydes are used, the polyvinyl alcohol is crosslinked. The crosslinking reaction can be accelerated by addition of acid.

The crosslinker is added to the laser-ablatable mask layer (iii) in general in amounts of 1 wt % up to a maximum of 20 wt %, based on the amount of all the components of the layer. A proportion of 1 to 10 wt % of crosslinker is preferred. The amount of polyvinyl alcohol, based on all the components of the laser-ablatable mask layer, is generally 20 to 50 wt %. The amount of crosslinker is therefore 2 to 40 parts by weight, preferably 2 to 20 parts by weight, per 100 parts by weight of the polyvinyl alcohol. The amount of crosslinked polyvinyl alcohol a), accordingly, is generally 21 to 70 wt %, based on the sum total of all components a) to c) of the laser-ablatable mask layer.

The laser-ablatable layer (iii) may optionally further comprise a mineral filler. Similarly to the situation in the adhesion layer, an additional filler may act as a spacer and improve the contact with the printing plate during UV exposure, thereby lessening the risk of undercutting.

Suitable fillers include, in particular, inorganic fillers and pigments. Particularly suitable fillers are, for example, silicon dioxide, more particularly finely ground quartzes and powdered quartzes, silicates, more particularly aluminum silicates, silicate glasses, aluminum oxides, iron oxides or chromium oxides.

The average particle diameter of the inorganic fillers is generally 0.1 to 6 μm and may therefore also be larger than the thickness of the laser-ablatable layer (see below) or larger than the average particle size of the carbon black particles used. This is a precondition so that the filler particles protrude out of the layer and are actually able to act as mechanical spacers. The morphology of the fillers is arbitrary.

The majority of fillers listed do not form round particles, but instead have arbitrary crystalline forms. The fillers may have been surface-treated or coated for particularly effective dispersion in the polymeric matrix.

The proportion of the mineral filler in the laser-ablatable mask layer (iii) is generally 0 to 30 wt %, based on all the components of the mask layer (iii). If an inorganic filler is included, then it is used in general in an amount of 5 to 30 wt %, based on the sum total of all components a) to c) of the mask layer.

The laser-ablatable mask layer (iii) comprises in general
a) 21 to 70 wt % of the binder comprising a crosslinked polyvinyl alcohol,
b) 5 to 70 wt % of the material which absorbs UV/VIS light and IR light, and
c) 0 to 30 wt % of the inorganic filler.

The thickness of the laser-ablatable mask layer (iii) is generally from 1 μm to 10 μm, preferably from 2 μm to 6 μm. At lower layer thicknesses it is difficult to achieve a homogeneous coating, absolutely free from pinholes, and to achieve the necessary optical density. At higher layer thicknesses, the laser sensitivity is too low and the laser time becomes too long. In that case, furthermore, scattering effects may occur during UV exposure, and may impair cliché quality. The optical density of the mask film in the UVA radiation range ought to amount to at least 2.5, preferably at least 3, units. The UVA radiation range encompasses light with a wavelength of 300 to 400 nm. The optical density is the logarithmic coefficient for the light intransmissibility of the layer within this wavelength range. On measurement of the optical density, therefore, the value determined is not an individual value of the light intransmissibility at a particular wavelength, but rather an average value of the light intransmissibilities within a defined wavelength range. The optical density is normally measured using commercially available densitometers (e.g., from x-rite), with the wavelength range being selected prior to measurement. For the purposes of the invention, all cited optical density measurement values are based on the UVA range, i.e., the range from 300 to 400 nm.

Of course, the primer layer (ii) and the laser-ablatable mask layer (iii) may also comprise further components such as plasticizers, flow control assistants, lubricants or other surface-active substances. In view of the outlined migration problem, the proportion of low molecular mass components in both layers ought to amount in total to less than 10 wt %, preferably less than 5 wt %. Low molecular mass components which may migrate into the printing plate that is to be exposed have a molecular weight of less than 1000 g/mol. This therefore means that the laser-ablatable mask films of the invention must contain at least 90 wt %, preferably at least 95 wt %, of components having a molecular weight of >1000 g/mol.

The individual layers of the mask films of the invention can be applied in any desired way by casting, spraying, rolling or doctor-blade methods.

First of all, the adhesion layer (ii) is applied to the polyester film. The components of the adhesion layer (ii) here are customarily in solution in organic solvents. Suitable organic solvents are, for example, ethyl acetate or methyl ethyl ketone (MEK). If a 2-component system is applied, the crosslinker is added to the coating solution shortly before the coating procedure. Following application, the adhesion layer is dried, with the drying temperature and the residence time being selected such that the crosslinker is quantitatively consumed by reaction with the polymeric component.

Subsequently, the laser-ablatable mask layer (iii) is applied. For this purpose, the polyvinyl alcohol is dissolved in water or in water/alcohol mixtures and then the carbon black component is added in portions. The solution is then run through a ball mill for several hours, to achieve fine dispersion of the carbon black. Thereafter the remaining components of the laser-ablatable layer are added. The solution is then applied in one or more steps to the PET sheet coated with the adhesion layer, after which drying is carried out. During drying, the recording layer is briefly heated to temperatures in the range from 90 to 120° C., with the polyvinyl alcohol being consumed by reaction with the crosslinker. Where the crosslinker used is glyoxal, the necessary drying times or reaction times at around 100° C. are within the range of a few seconds.

Depending on the laser used, the mask films of the invention can be digitally imaged (lasered) to a resolution of up to 10000 dpi. Examples of suitable laser systems are lasers of the CDI or CDI Spark series from Esko Graphics. These lasers operate at a wavelength of 1064 nm or 1070 nm, respectively, and possess a corresponding energy input. Alternatively, the mask films can also be digitally imaged with diode lasers (830 nm), provided the necessary laser energy can be introduced. The energy required for ablating the mask films of the invention is generally from 3 to 5 J/cm$^2$.

For imaging by laser ablation, the mask films are stretched onto the drum of the laser. The laser energy required is determined by measuring the optical density on complete ablation of a surface. When set correctly, this OD$_{min}$ ought to be <than 0.2, preferably 0.1 unit. For determining the necessary laser energy, various surfaces are ablated with different energies. The surfaces removed by laser must be very highly transparent to the UV light. An optical density of 0.1 means that the film transmits 90% of the UV light. The surface is therefore correctly removed by lasering.

Another subject of the invention is a method for producing a flexographic printing cliché, comprising the following steps:

(i) digital imaging by laser ablation of the mask film of the invention,
(ii) placement or lamination of the digitally imaged mask film onto the flexographic printing plate that is to be exposed,
(iii) exposure of the relief-forming layer of the printing plate with UVA light through the digitally imaged mask film,
(iv) removal of the mask film,
(v) development of the relief by removal of the unpolymerized portions of the relief-forming layer with a washout medium or by thermal development,
(vi) optionally, drying of the resulting flexographic cliché,
(vii) optionally, aftertreatment of the flexographic cliché with UVA or UVC light.

Another subject of the invention is the use of the mask films of the invention for exposure of relief printing plates and screen printing stencils.

Another subject of the invention is the use of the mask films of the invention for production of correction films.

EXAMPLE

A PET sheet of the Melinex® OD type, 175 µm thick, was coated with an adhesion layer (primer layer). The composition of the primer layer is reproduced in table 1.

TABLE 1

| Component | Chemistry/Function | Manufacturer | Solids fraction (wt %) |
|---|---|---|---|
| Desmocoll ® 400/1 | PUR/Binder | Bayer | 82 |
| Desmodur ® RN | Isocyanate/ Crosslinker | Bayer | 10 |
| Syloid ® ED3 | Silicate/Filler | Degussa | 8 |
| Total | | | 100 |

The binder of the primer layer was dissolved in ethyl acetate. Then the filler was added and the dispersion was stirred for 2 hours. Shortly before coating, the crosslinker was added, and the solids content of the mixture was adjusted to 3 wt % by addition of ethyl acetate. The solution was applied in a metering roll application process on a coating line at a belt speed of 10 m/min. The layer was subsequently dried at 105° C. (drying tunnel length: 9 m). After drying, the coat weight was 1.2 g/m$^2$. No free isocyanate was detectable in the layer.

The PET sheet coated with the primer was subsequently top coated with the laser-ablatable mask layer. The composition of this layer is reproduced in table 2.

TABLE 2

| Component | Chemistry/ Function | Manufacturer | Solids fraction (wt %) |
|---|---|---|---|
| Alcotex ® 72.5 | PVA/Binder | Kuraray | 65.2 |
| Levanyl ® Schwarz A-SF | Carbon black dispersion/IR absorber | Lanxess | 30.0 |
| Syloid ® ED3 | Silicate/Filler | Degussa | 2.0 |
| Glyoxal | Crosslinker | BASF | 2.8 |
| Total | | | 100 |

To prepare the casting solution, the polyvinyl alcohol was dissolved in a mixture of water/n-propanol (3/1). Thereafter the carbon black dispersion and the filler were incorporated in portions with stirring and the mixture was run through a ball mill for 2 hours. Shortly before coating, the glyoxal was added, the solids content was adjusted to 8.2 wt % by dilution, and the pH was adjusted to 4 by addition of 7 wt % strength hydrochloric acid.

The solution was applied in a metering roll application process on a coating line at a belt speed of 10 m/min. Subsequently, again, the layer was dried at 105° C. (drying tunnel length 9 m). After drying, the coat weight was 5.0+/−0.2 g/m$^2$ (measured in each case at a distance of 10 cm over the whole coating width of 1.2 m). Glyoxal was no longer detectable in the dried layer. The coating was absolutely flawless. No pinholes or coating defects at all could be found. The optical density of the coating (again measured at a distance of 10 cm in each case over the whole coating width) was between 4.9 and 5.0.

After a storage time of 2 weeks, the mask film produced was imaged on an Esko laser (CDI Spark 4835) at a resolution of 4000 dpi with a nyloflex test motive (Flint Group). The test motive included a halftone wedge with tonal values of 1% to 100% with a line width of 47 L/cm.

The film was mounted onto the drum of the laser and ablated with an energy of 4.5 J/cm$^2$. The film presented no handling problems. Even when handled without protective gloves, no prints or other damage could be found on the mask film. The solid area removed by lasering had an optical density of 0.1. The ablated elements of the mask film were all imaged with crisp edges.

The ablated mask film was used to produce a flexographic printing plate (nyloflex ACE 114, Flint Group). The coversheet was removed from the printing plate. The ablated mask film was placed by the layer side onto the printing plate surface and was fixed with a vacuum sheet in a nyloflex FIII exposure unit (Flint Group). The printing plate was subsequently exposed through the mask film for 14 minutes using UVA radiation. Following exposure, the mask film was removed from the printing plate. The flexo plate was subsequently washed out by means of a commercial organic washout medium (Nylosoiv® A, Flint Group) in a nyloflex F III washout apparatus (Flint Group) in a transit time of 240 mm/min. After the washout operation, the printing plate was dried at 60° C. for 90 minutes and then aftertreated with UVA and UVC light. The cliché was examined by microscope. The half tone dots of the 1% tonal value were immaculately imaged on the cliché.

Using the same mask film, 10 further flexographic printing plates were exposed and further-processed. The quality of cliché produced was identical. No deviations could be found in the dimensions of the typical test elements of a flexo cliché (1% positive half tone dot, in-between depth in the 200 μm negative dot, 50 μm positive lattice lines).

The invention claimed is:

1. A laser-ablatable mask film for the exposure of relief printing plates and screen printing stencils, comprising at least
   (i) a dimensionally stable base sheet,
   (ii) a UV-transparent adhesion layer, and
   (iii) a laser-ablatable mask layer which has a thickness from 1 μm to 10 μm,
   wherein the laser-ablatable mask layer (iii) comprises
   a) a binder comprising a crosslinked polyvinyl alcohol,
   b) a material which absorbs UV/VIS light and IR light, and
   c) optionally an inorganic filler and wherein the crosslinked polyvinyl alcohol is crosslinked with 2 to 40 parts by weight of crosslinker per 100 parts by weight of polyvinyl alcohol.

2. The laser-ablatable mask film as claimed in claim 1, wherein the polyvinyl alcohol of the binder a) is a partially hydrolyzed polyvinyl acetate having a degree of hydrolysis of 50 to 99 mol %.

3. The laser-ablatable mask film as claimed in claim 1, wherein the polyvinyl alcohol of the binder a) is crosslinked with glyoxal or glutaraldehyde.

4. The laser-ablatable mask film as claimed in claim 1, wherein the laser-ablatable mask layer (iii) has an optical density of >2.5.

5. The laser-ablatable mask film as claimed in claim 1, wherein the material b) which absorbs UV/VIS light and IR light is selected from the group consisting of carbon black, graphite, carbon nanotubes, and carbon nanoparticles.

6. The laser-ablatable mask film as claimed in claim 1, wherein the laser-ablatable mask layer (iii) comprises
   a) 21 to 70 wt % of the binder comprising a crosslinked polyvinyl alcohol,
   b) 5 to 70 wt % of the material which absorbs UV/VIS light and IR light, and
   c) 0 to 30 wt % of the inorganic filler.

7. The laser-ablatable mask film as claimed in claim 1, wherein the laser-ablatable mask layer (iii) comprises
   c) 5 to 30 wt % of the inorganic filler.

8. The laser-ablatable mask film as claimed in claim 1, wherein the adhesion layer (ii) comprises
   d) 70 to 100 wt % of a polymeric binder,
   e) 0 to 30 wt % of a crosslinker,
   f) 0 to 30 wt % of an inorganic filler.

9. The laser-ablatable mask film as claimed in claim 8, wherein the polymeric binder d) is selected from the group consisting of polyesters, polyetheresters, polyurethanes, and polyesterurethanes.

10. The laser-ablatable mask film as claimed in claim 8, wherein the polymeric binder d) is a polymer which contains OH groups and which is crosslinked with a polyfunctional isocyanate as crosslinker e).

11. A method for producing a flexographic cliché, comprising the steps of
   (i) digital imaging by laser ablation of the mask film as defined in claim 1,
   (ii) placing or laminating the digitally imaged mask film onto a flexographic printing plate that is to be exposed,
   (iii) exposing a relief-forming layer of the printing plate with UVA light through the digitally imaged mask film,
   (iv) removing of the mask film,
   (v) developing a relief by removal of the unpolymerized portions of the relief-forming layer with a washout medium or by thermal development,
   (vi) optionally, drying of the resulting flexographic cliché, optionally, aftertreatment of the flexographic cliché with UVA or UVC light.

12. The laser-ablatable mask film as claimed in claim 1, wherein the laser-ablatable mask layer (iii) has a thickness from 2 μm to 6 μm.

13. The laser-ablatable mask film as claimed in claim 1, wherein the stable base sheet (i) is a polyester film.

14. The laser-ablatable mask film as claimed in claim 1, wherein the polyester film is a polyethylene terephthalate (PET) film.

15. The laser-ablatable mask film as claimed in claim 1, wherein the crosslinked polyvinyl alcohol is crosslinked with 2 to 20 parts by weight of crosslinker per 100 parts by weight of polyvinyl alcohol.

16. A laser-ablatable mask film for the exposure of relief printing plates and screen printing stencils, comprising at least (i) a dimensionally stable base sheet,
(ii) a UV-transparent adhesion layer, and
(iii) a laser-ablatable mask layer which has a thickness from 1 µm to 10 µm,
wherein the laser-ablatable mask layer (iii) comprises
a) a binder comprising a crosslinked polyvinyl alcohol,
b) a material which absorbs UV/VIS light and IR light, and
c) optionally an inorganic filler and
the adhesion layer (ii) comprises
d) 70 to 100 wt % of a polymeric binder,
e) 0 to 30 wt % of a crosslinker,
f) 0 to 30 wt % of an inorganic filler and
wherein the polymeric binder d) is a polymer which contains OH groups and which is crosslinked with a polyfunctional isocyanate as crosslinker e).

17. The laser-ablatable mask film as claimed in claim 16, wherein the crosslinked polyvinyl alcohol is crosslinked with 2 to 40 parts by weight of crosslinker per 100 parts by weight of polyvinyl alcohol.

18. The laser-ablatable mask film as claimed in claim 16, wherein the polyvinyl alcohol of the binder a) is a partially hydrolyzed polyvinyl acetate having a degree of hydrolysis of 50 to 99 mol %.

19. The laser-ablatable mask film as claimed in claim 16, wherein the polyvinyl alcohol of the binder a) is crosslinked with glyoxal or glutaraldehyde.

20. The laser-ablatable mask film as claimed in claim 16, wherein the laser-ablatable mask layer (iii) has an optical density of >2.5.

21. The laser-ablatable mask film as claimed in claim 16, wherein the material b) which absorbs UV/VIS light and IR light is selected from the group consisting of carbon black, graphite, carbon nanotubes, and carbon nanoparticles.

22. The laser-ablatable mask film as claimed in claim 16, wherein the laser-ablatable mask layer (iii) comprises
   a) 21 to 70 wt % of the binder comprising a crosslinked polyvinyl alcohol,
   b) 5 to 70 wt % of the material which absorbs UV/VIS light and IR light, and
   c) 0 to 30 wt % of the inorganic filler.

23. The laser-ablatable mask film as claimed in claim 22, wherein the laser-ablatable mask layer (iii) comprises
   c) 5 to 30 wt % of the inorganic filler.

24. The laser-ablatable mask film as claimed in claim 22, wherein the polymeric binder d) is selected from the group consisting of polyesters, polyetheresters, polyurethanes, and polyesterurethanes.

25. A method for producing a flexographic cliché, comprising the steps of
   (i) digital imaging by laser ablation of the mask film as defined in claim 16,
   (ii) placing or laminating the digitally imaged mask film onto a flexographic printing plate that is to be exposed,
   (iii) exposing a relief-forming layer of the printing plate with UVA light through the digitally imaged mask film,
   (iv) removing of the mask film,
   (v) developing a relief by removal of the unpolymerized portions of the relief-forming layer with a washout medium or by thermal development,
   (vi) optionally, drying of the resulting flexographic cliché, optionally, aftertreatment of the flexographic cliché with UVA or UVC light.

26. The laser-ablatable mask film as claimed in claim 16, wherein the laser-ablatable mask layer (iii) has a thickness from 2 µm to 6 µm.

27. The laser-ablatable mask film as claimed in claim 16, wherein the stable base sheet (i) is a polyester film.

28. The laser-ablatable mask film as claimed in claim 16, wherein the polyester film is a polyethylene terephthalate (PET) film.

29. The laser-ablatable mask film as claimed in claim 16, wherein the crosslinked polyvinyl alcohol is crosslinked with 2 to 20 parts by weight of crosslinker per 100 parts by weight of polyvinyl alcohol.

* * * * *